(12) United States Patent
Hsiung

(10) Patent No.: US 8,434,798 B2
(45) Date of Patent: May 7, 2013

(54) ATTACHING STRUCTURE AND ELECTRONIC DEVICE USING SAME

(75) Inventor: Ming-Chun Hsiung, Shindian (TW)

(73) Assignee: FIH (Hong Kong) Limited, Kowloon (HK)

( * ) Notice: Subject to any disclaimer, the term of this patent is extended or adjusted under 35 U.S.C. 154(b) by 296 days.

(21) Appl. No.: 12/903,304

(22) Filed: Oct. 13, 2010

(65) Prior Publication Data

US 2012/0000907 A1  Jan. 5, 2012

(30) Foreign Application Priority Data

Jun. 30, 2010 (CN) .......................... 2010 1 0213623

(51) Int. Cl.
*E05C 5/04* (2006.01)
*E05C 5/00* (2006.01)

(52) U.S. Cl.
USPC . 292/251; 292/1; 292/DIG. 53; 292/DIG. 54; 403/408.1

(58) Field of Classification Search .............. 292/1, 251, 292/DIG. 53, DIG. 54, DIG. 64; 403/408.1
See application file for complete search history.

(56) References Cited

U.S. PATENT DOCUMENTS

| | | | | |
|---|---|---|---|---|
| 748,078 A * | 12/1903 | Kaisling | ........................ | 292/251 |
| 999,891 A * | 8/1911 | Sheppard | ...................... | 292/251 |
| 1,856,091 A * | 5/1932 | Dina | ............................. | 292/251 |
| 2,639,179 A * | 5/1953 | Phelps | ........................... | 292/251 |
| 2,691,543 A * | 10/1954 | Morand | ........................... | 292/1 |
| 2,839,322 A * | 6/1958 | Kirk | ............................. | 292/251 |
| 2,991,904 A * | 7/1961 | Carideo | ....................... | 220/231 |
| 3,486,751 A * | 12/1969 | Jamison et al. | ................ | 472/118 |
| 3,922,101 A * | 11/1975 | Salmon et al. | ............... | 403/292 |
| 4,414,829 A * | 11/1983 | Nielsen et al. | .................. | 70/160 |
| 4,629,228 A * | 12/1986 | Marko et al. | .................. | 292/165 |
| 5,079,935 A * | 1/1992 | Zaucha | .......................... | 70/140 |
| 6,669,401 B1 * | 12/2003 | Lin | ............................ | 403/408.1 |
| 7,520,693 B2 * | 4/2009 | Werman et al. | ............ | 403/408.1 |

* cited by examiner

*Primary Examiner* — Carlos Lugo
(74) *Attorney, Agent, or Firm* — Altis Law Group, Inc.

(57) ABSTRACT

An attaching structure is used for assembling a first member to a second member. The attaching structure includes a latching element and the connecting assembly. The latching element is assembled to the first member. The connecting assembly includes a seat and a fastener. The seat adjustably latches to the latching element. The fastener is threaded into the first member, the second member, and matches with the seat.

17 Claims, 5 Drawing Sheets

ATTACHING STRUCTURE AND ELECTRONIC DEVICE USING SAME

BACKGROUND

1. Technical Field

The present disclosure relates to attaching structures for electronic devices.

2. Description of Related Art

In assembling electronic devices, many subsidiary pieces need to be secured to a main housing of the electronic device. A typical method uses screws to fasten the subsidiary piece to the main housing. However, most of the subsidiary pieces are thin and usually made of plastic. The screws may be easily lost after a period of time. Plus, due to the fragile nature of plastic, it is difficult to have a tight engagement between the subsidiary and the main housing.

Therefore, there is room for improvement within the art.

BRIEF DESCRIPTION OF THE FIGURES

Many aspects of the attaching structure and electronic device using the same can be better understood with reference to the following figures. The components in the figures are not necessarily drawn to scale, the emphasis instead being placed upon clearly illustrating the principles of the attaching structure and electronic device using the same. Moreover, in the drawings like reference numerals designate corresponding parts throughout the several views.

DETAILED DESCRIPTION

Figure 1:
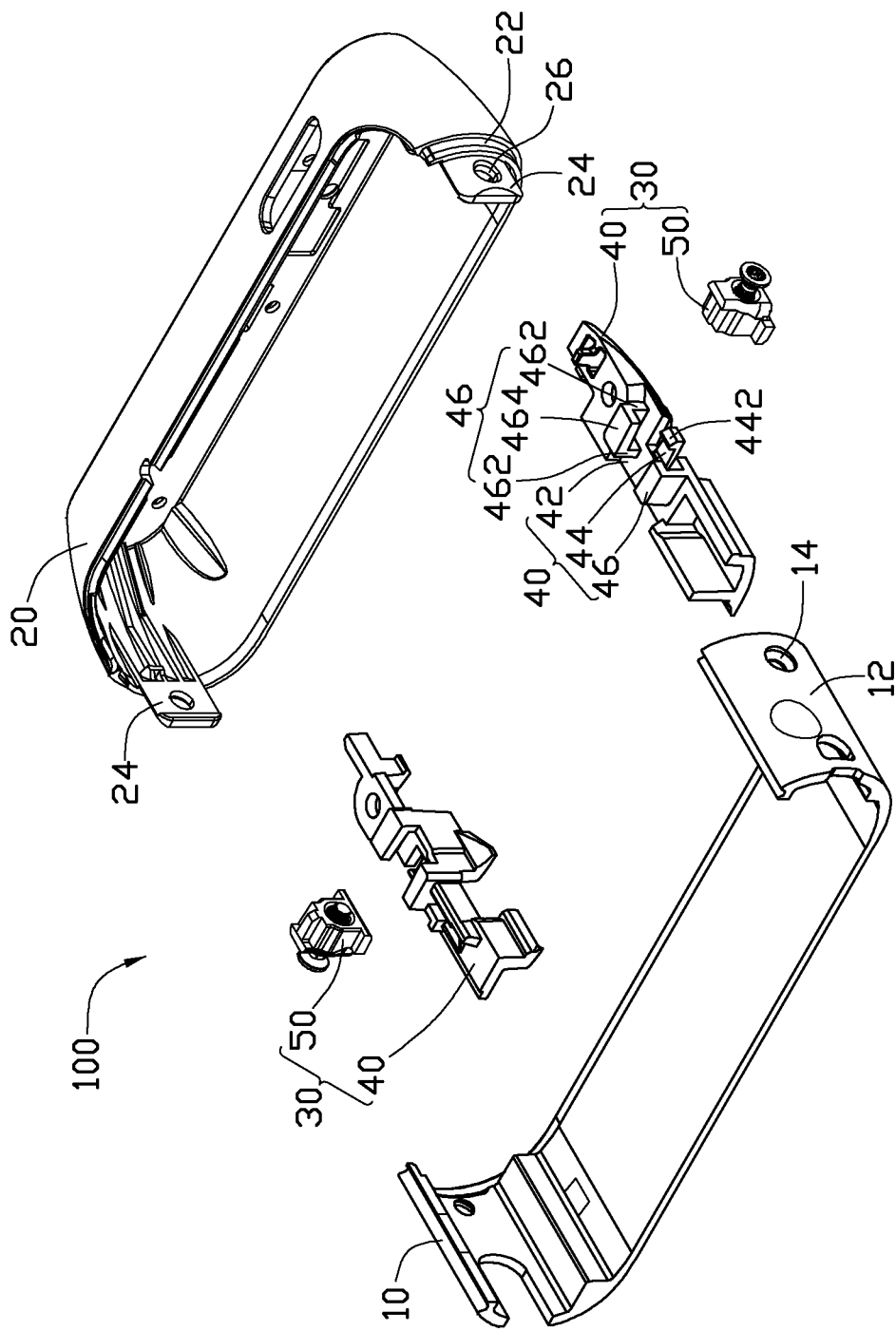
FIG. 1 is an exploded, isometric view of an exemplary embodiment of an attaching structure used to an electronic device.

FIG. 1 shows an exemplary electronic device 100 including a first member 10, a second member 20, and two attaching structures 30. The attaching structures 30 are for connecting the first member 10 to the second member 20.

The first member 10 may be made of metal, and in an exemplary embodiment can be a part of a housing of the electronic device 100. The first member 10 includes opposing sidewalls 12. Each sidewall 12 defines at least one through hole 14.

The second member 20 may be made of plastic, and is for being assembled to the first member 10. The second member 20 includes a step 22 and an extending arm 24 on opposite sides of the second member 20. Each extending arm 24 extends from one of the steps 22. The steps 22 are detachably assembled to the first member 10. Each extending arm 24 defines an assembly hole 26. When the second member 20 is assembled to the first member 10, the assembly hole 26 aligns with the through hole 14.

Figure 3:
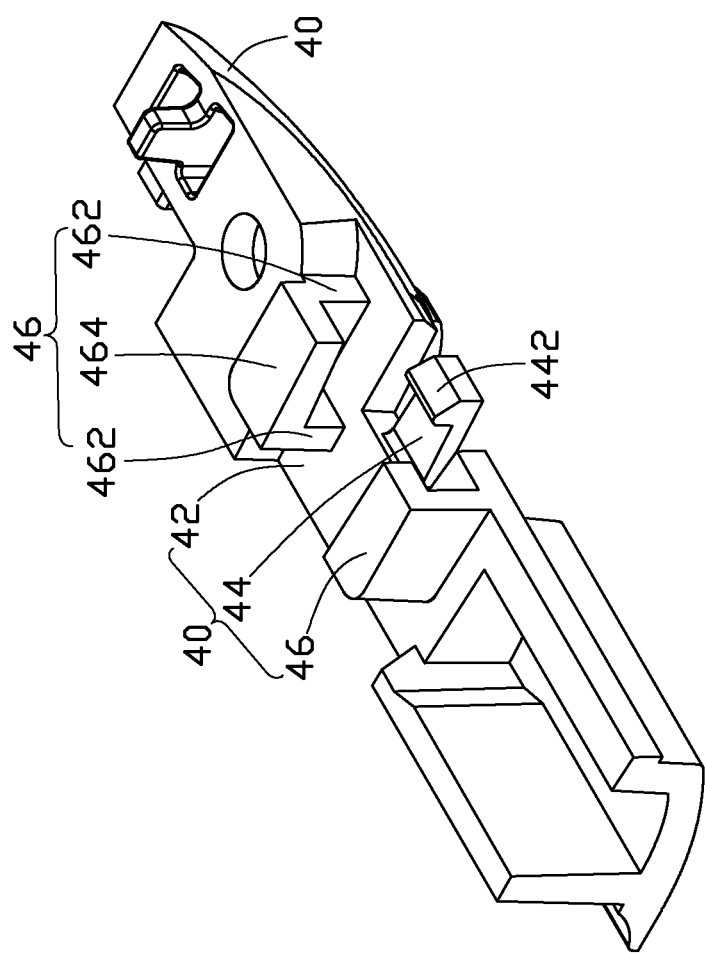
FIG. 3 is an isometric view of a latching element shown in FIG. 1.

Each attaching structure 30 includes a latching element 40 and a connecting assembly 50. The latching element 40 may be made of plastic, and assembled to the first member 10 adjacent to the sidewall 12. Referring to FIG. 3, the latching element 40 includes a plate 42, a resisting arm 44, and two retaining portions 46. The resisting arm 44 extends from the plate 42, and a hook 442 is formed on an end of the resisting arm 44. Each retaining portion 46 includes two resisting plates 462 and a top plate 464. The resisting plates 462 are oriented at a right angle, and mounted on the plate 42. The top plate 464 is positioned on the top of the resisting plates 462.

Figure 2:
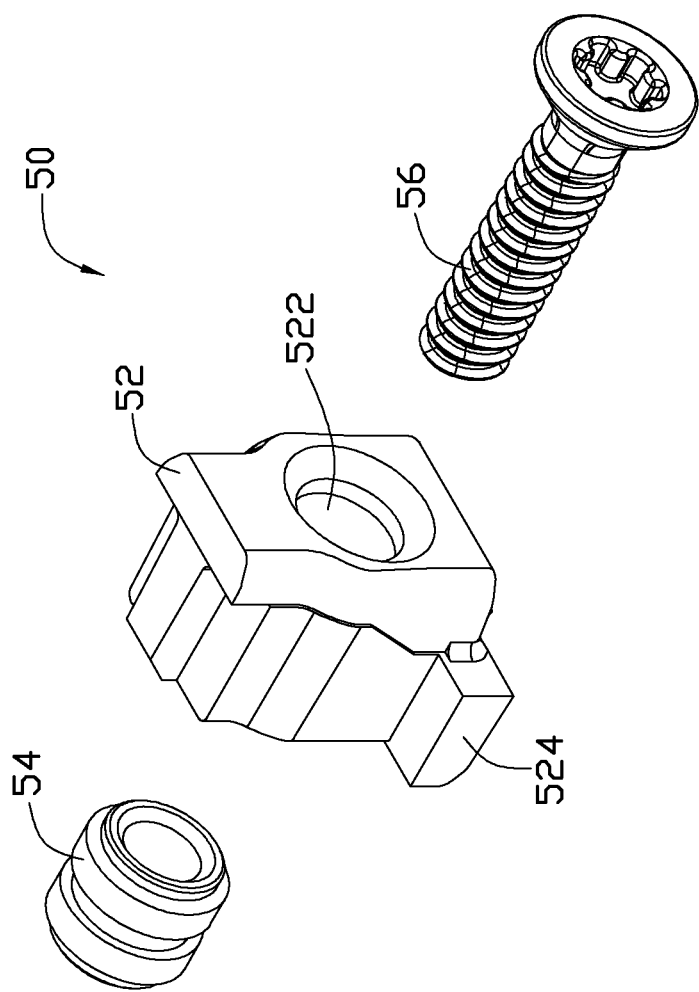
FIG. 2 is an exploded, isometric view of a connecting assembly used in the electronic device.

Referring to FIG. 2, the connecting assembly 50 includes a seat 52, an insert 54, and a fastener 56. The seat 52 may be made of plastic, and defines a round hole 522. A block 524 extends from each opposite side of the seat 52. When the seat 52 is assembled in the latching element 40, the blocks 524 are latched with the retaining portions 46. A gap 70 (shown in FIG. 5) is defined between the seat 52 and the retaining portions 46, to allow adjustment of the position of the seat 52 along vertical traverse (X-axis) and the horizontal (Y-axis) shown in FIG. 5 based on the positions of the first member 10 and the second member 20 relative to each other. The insert 54 is a hollow metal cylinder. An inner peripheral wall of the insert 54 defines an internal thread. The insert 54 can be secured in the round hole 522 by the hot melt method. The fastener 56 is a bolt in this exemplary embodiment, and can be threaded into the first member 10, the second member 20, and the insert 54 for fixing the position of the second member 20 relative to the first member 10. The seat 52 may be made of metal, the fastener 56 engages to the round hole 522.

Figure 4:
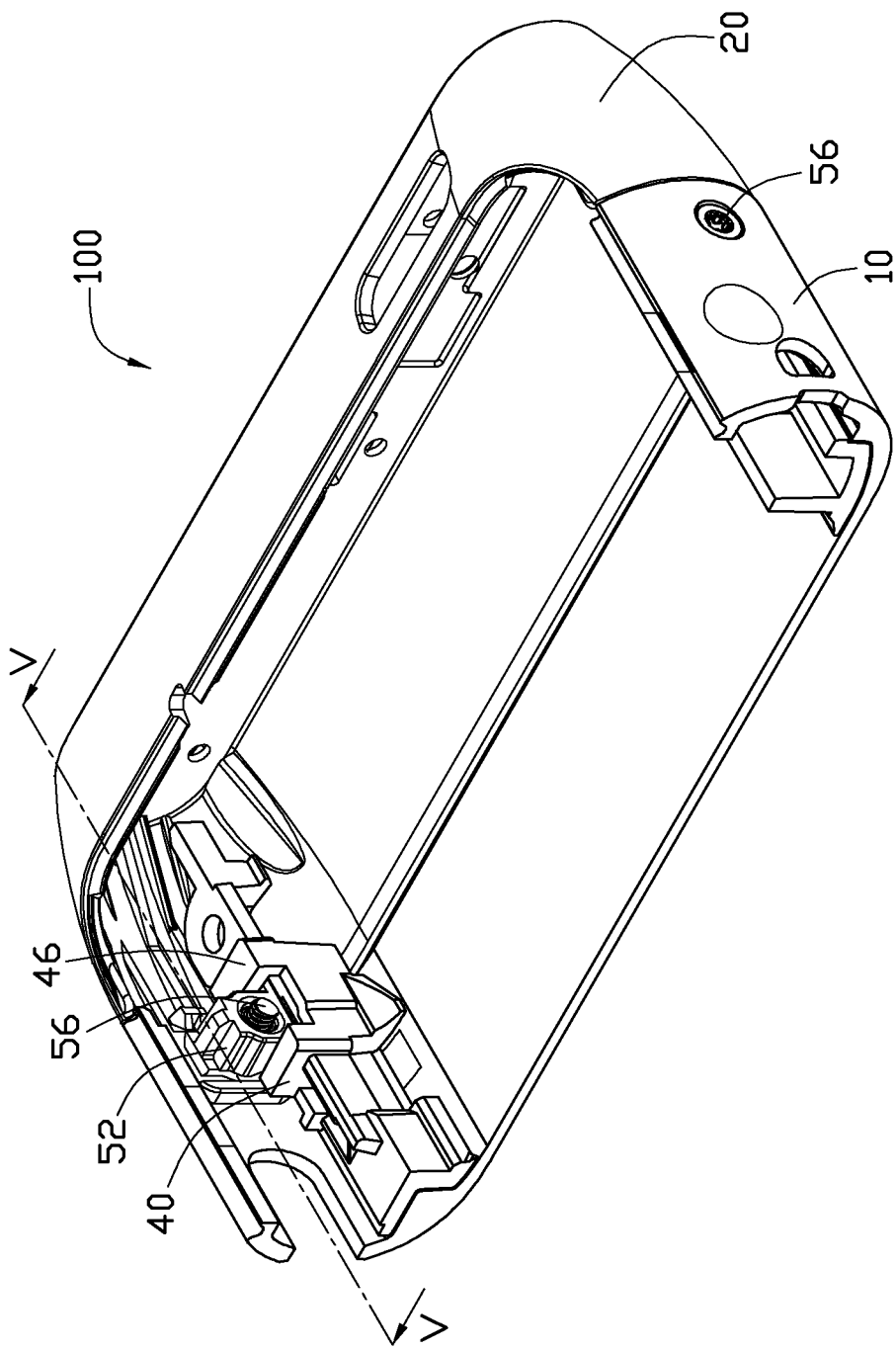
FIG. 4 is a partially assembled view of the electronic device shown in FIG. 1.
Figure 5:
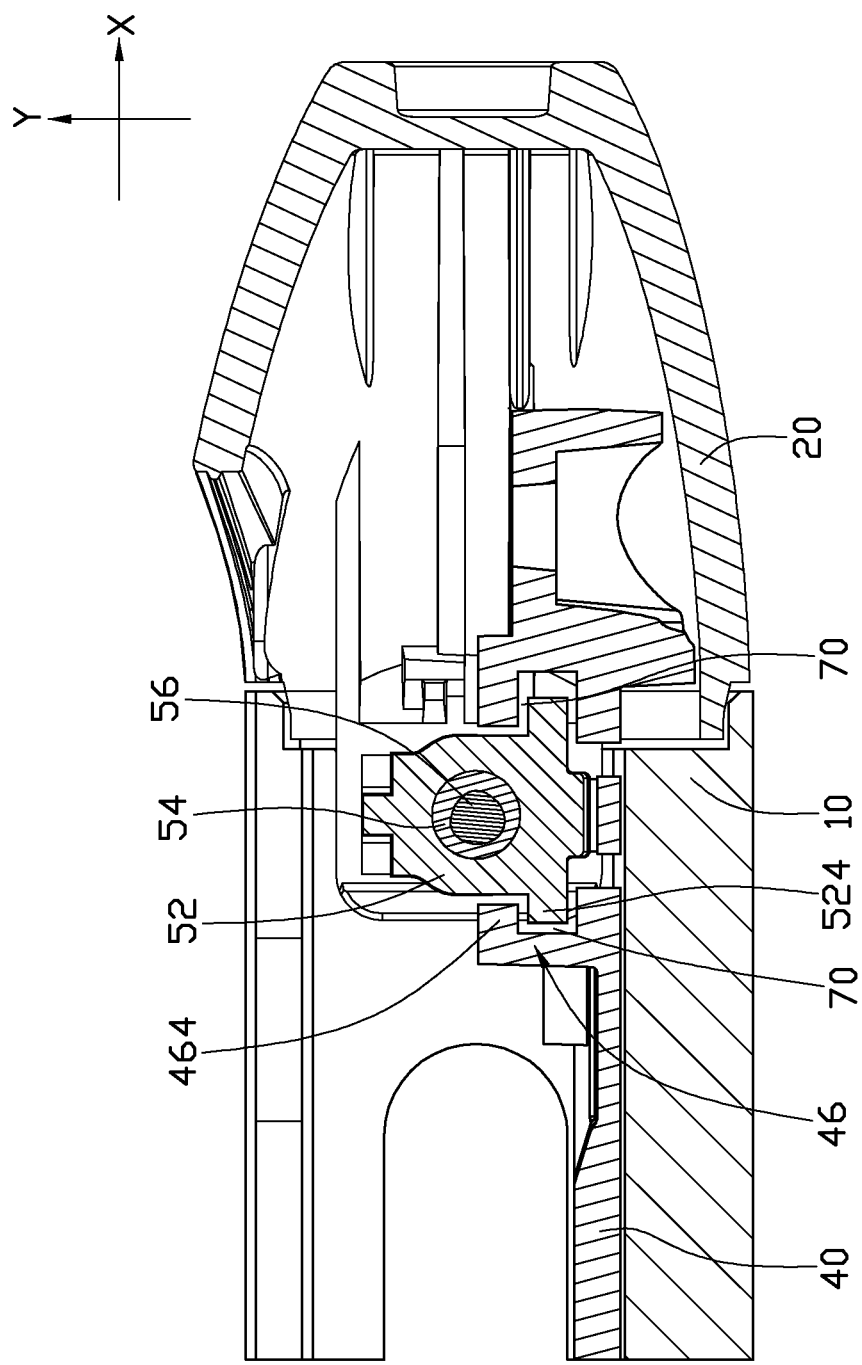
FIG. 5 is a cross-sectional view of the electronic device of FIG. 3 taken along line V-V.

Referring to FIGS. 4 to 5, when the electronic device 100 is to be assembled, the insert 54 is fixed in the round hole 522 and the blocks 524 are respectively latched with the retaining portions 46. The position of the seat 52 is latched by the resisting plates 462 and the hook 442. The latching element 40 and the seat 52 are received in the electronic device 100 and resist the extending arm 24. The round hole 522 is aligned with the through hole 26 after adjustment. The first member 10 is assembled to the second member 20, and the through hole 14 aligned with the assembly hole 26 and the round hole 522. Finally, the fastener 56 is threaded into the through hole 14, assembly hole 26, and matches with the internal thread of the insert 54. Thus, the second member 20 is locked to the first member 10, further the seat 52 is secured.

The electronic device 100 includes a latching element 40 assembled to the first member 10 attach the seat 52. When the second member 20 is assembled to the first member 10, only use the fastener 56 matching with the insert 54. Therefore, the second member 20 can be easily and tightly assembled to the first member 10.

It should be understood, however, that even though numerous characteristics and advantages of the present embodiments have been set forth in the foregoing description, together with details of the structures and functions of the embodiments, the disclosure is illustrative only, and changes may be made in detail, especially in matters of shape, size, and arrangement of parts within the principles of the present disclosure to the full extent indicated by the broad general meaning of the terms in which the appended claims are expressed.

What is claimed is:

1. An attaching structure for assembling a first member to a second member, the first member defining a through hole and the second member defining an assembly hole aligned with the through hole, the attaching structure comprising:
   a latching element assembled to the first member, the latching element comprising a plate, a resisting arm extending from the plate, and two opposite retaining portions mounted on the plate;
   a connecting assembly comprising a seat and a fastener; the seat coupled to the two opposite retaining portions of the latching element, and the fastener extending through the through hole and the assembly hole, and being fastened to the seat to assemble the first member in a fixed position relative to the second member.

2. The attaching structure as claimed in claim 1, wherein the seat defines a round hole, the connecting assembly comprises an insert, the insert is secured in the round hole, the fastener is engaged in the round hole.

3. The attaching structure as claimed in claim 2, wherein the insert is a hollow cylinder, an inner peripheral wall of the insert defines an internal thread, the insert is secured in the round hole by hot melt method, and the fastener is threadedly engaged with the internal thread of the insert.

4. The attaching structure as claimed in claim 3, wherein the seat is latched between the two retaining portions.

5. The attaching structure as claimed in claim 4, wherein an end of the resisting arm comprises a hook, the hook latched to the seat.

6. The attaching structure as claimed in claim 4, wherein the seat comprises two opposite blocks, each block extending from a side of the seat, the blocks latched to the retaining portions.

7. The attaching structure as claimed in claim 4, wherein each retaining portion comprises two resisting plates and a top plate formed with the resisting plates, the resisting plates connecting each other and mounted on the plate, the top plate is positioned on the top of the resisting plates.

8. The attaching structure as claimed in claim 1, wherein each retaining portion and the seat define a gap therebetween, the gap allows adjustment of the position of the seat based on the positions of the first member and the second member relative to each other.

9. An electronic device, comprising:
a first member defining a through hole;
a second member assembled to the first member and defining an assembly hole aligned with the through hole;
an attaching structure comprising a latching element and a connecting assembly; the latching element mounted on the first member and the latching element comprising a plate, a resisting arm extending from the plate, and two opposite retaining portions mounted on the plate, the connecting assembly comprising a seat and a fastener; the seat coupled to the two opposite retaining portions and the fastener extending through the through hole and the assembly hole, and being fastened to the seat to assemble the first member to the second member.

10. The electronic device as claimed in claim 9, wherein the fastener is threaded into the first member and the second member, and the fastener matches with the seat.

11. The electronic device as claimed in claim 10, wherein the seat defines a round hole passing through thereof, the connecting assembly comprises an insert, the insert is secured in the round hole, the fastener is engaged in the round hole.

12. The electronic device as claimed in claim 11, wherein the insert is a hollow cylinder, an inner peripheral wall of the insert defines an internal thread, the insert is secured in the round hole by hot melt method, and the fastener is threadedly engaged with the internal thread of the insert.

13. The electronic device as claimed in claim 12, wherein the seat is latched between the two retaining portions.

14. The attaching structure as claimed in claim 13, wherein an end of the resisting arm comprises a hook, the hook latches to the seat.

15. The electronic device as claimed in claim 13, wherein the seat comprises two opposite blocks, each block extending from a side of the seat, the blocks latched to the retaining portions.

16. The electronic device as claimed in claim 13, wherein each retaining portion comprises two resisting plates and a top plate formed with the resisting plates, the resisting plates connect each other and are mounted on the plate, the top plate is positioned on the top of the resisting plates.

17. The electronic device as claimed in claim 9, wherein each retaining portion and the seat define a gap therebetween, the gap allows adjustment of the position of the seat based on the positions of the first member and the second member relative to each other.

* * * * *